(12) United States Patent
Kamio et al.

(10) Patent No.: US 11,744,019 B2
(45) Date of Patent: Aug. 29, 2023

(54) COMPONENT MOUNTED ON CIRCUIT BOARD

(71) Applicant: Murata Manufacturing Co., Ltd., Nagaokakyo (JP)

(72) Inventors: Shigeyuki Kamio, Nagaokakyo (JP); Makoto Takeoka, Nagaokakyo (JP); Sho Suzuki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/505,674

(22) Filed: Oct. 20, 2021

(65) Prior Publication Data

US 2022/0159840 A1    May 19, 2022

(30) Foreign Application Priority Data

Nov. 18, 2020 (JP) .................................. 2020-191829
Apr. 27, 2021 (JP) .................................. 2021-075228

(51) Int. Cl.
| H05K 9/00 | (2006.01) |
| H05K 1/18 | (2006.01) |
| H05K 1/03 | (2006.01) |
| H05K 1/11 | (2006.01) |
| H05K 1/02 | (2006.01) |

(52) U.S. Cl.
CPC .......... *H05K 1/181* (2013.01); *H05K 1/0306* (2013.01); *H05K 1/11* (2013.01); *H05K 9/0024* (2013.01); *H05K 9/0028* (2013.01); *H05K 1/0237* (2013.01); *H05K 1/185* (2013.01);

(Continued)

(58) Field of Classification Search
CPC ....... H05K 2201/10371; H05K 1/0216; H05K 9/0024; H05K 2201/0707; H05K 2201/10742; H05K 2201/1075; H05K 2201/10931; H05K 2201/1081; H05K 2201/10803; H05K 2201/10772; H05K 9/0028; H05K 2201/10916; H01L 23/552;

(Continued)

(56) References Cited

U.S. PATENT DOCUMENTS 6,462,436 B1 * 10/2002 Kay ....................... H04B 15/02
                                                      361/818
2005/0168952 A1 * 8/2005 Chen ....................... H01L 23/10
                                                      257/E23.181

(Continued)

FOREIGN PATENT DOCUMENTS

| JP | 2013-168520 A | 8/2013 |
| WO | 2006/059556 A1 | 6/2006 |

*Primary Examiner* — Steven T Sawyer
(74) *Attorney, Agent, or Firm* — XSENSUS LLP

(57) ABSTRACT

A component includes a main member that includes a first surface that opposes a circuit board, the component being mounted to the circuit board during an assembly procedure, and a plurality of legs that protrude from the first surface, the plurality of legs having ends, wherein the component is mounted on the circuit board with the ends of the plurality of legs fixed to the circuit board, each of the ends of the plurality of legs includes an end surface that opposes the circuit board at time of the assembly procedure, and also includes a bevel that is continuous with the end surface and inclined with respect to the end surface, and an interior angle formed between the end surface and the bevel is larger than or equal to 120° and smaller than or equal to 170°.

15 Claims, 19 Drawing Sheets

(52) U.S. Cl.
CPC ........... *H05K 2201/0707* (2013.01); *H05K 2201/10371* (2013.01); *H05K 2201/10803* (2013.01)

(58) Field of Classification Search
CPC ............ H01L 23/04; H01L 23/10; H01L 2924/16152; H01L 2924/16315
See application file for complete search history.

(56) References Cited

U.S. PATENT DOCUMENTS

| | | | |
|---|---|---|---|
| 2010/0085719 A1* | 4/2010 | Lu | H05K 9/0026 257/659 |
| 2018/0048399 A1* | 2/2018 | Thiruvarankan | H04B 17/101 |
| 2020/0256752 A1* | 8/2020 | Okawa | G01L 9/0042 |
| 2021/0307220 A1* | 9/2021 | Yamauchi | H05K 9/0028 |

* cited by examiner

COMPONENT MOUNTED ON CIRCUIT BOARD

CROSS-REFERENCE TO RELATED APPLICATIONS

The present application claims priority to Japanese patent application JP 2020-191829, filed Nov. 18, 2020, and JP 2021-075228, filed Apr. 27, 2021, the entire contents of each of which being incorporated herein by reference.

BACKGROUND

1. Field of the Disclosure

The present disclosure relates to a component mounted on a circuit board.

2. Description of the Related Art

International Publication No. 2006-059556 discloses a hybrid integrated circuit (IC) including multiple surface-mount devices mounted on a circuit board and a covering member covering the surface-mount devices. The covering member includes a ceiling formed from a plane ceramic member, and multiple legs with approximately the same height as the surface-mount devices. The multiple legs are fixed to the circuit board at the lower ends by soldering or another method.

SUMMARY

The circuit board is warped when the covering member and the circuit board are heated to mount the covering member on the circuit board. This warpage may change the connection state between the ends of the legs of the covering member and the circuit board, and cause failures in connection between the circuit board and the legs. Accordingly, it is an aspect of the present disclosure to provide a component that can be reproducibly mounted on a circuit board regardless of when, for example, the circuit board is warped.

According to an aspect of the present disclosure, a component includes a main member that includes a first surface that opposes a circuit board, the component being mounted to the circuit board during an assembly procedure, and a plurality of legs that protrude from the first surface, the plurality of legs having ends, wherein the component is mounted on the circuit board with the ends of the plurality of legs fixed to the circuit board, each of the ends of the plurality of legs includes an end surface that opposes the circuit board at time of the assembly procedure, and also includes a bevel that is continuous with the end surface and inclined with respect to the end surface, and an interior angle formed between the end surface and the bevel is larger than or equal to 120° and smaller than or equal to 170°.

According to another aspect of the present disclosure, a component includes a main member including a first surface; and a plurality of legs protruding from the first surface, wherein each of the plurality of legs includes an end surface and a bevel, the bevel being continuous with the end surface and inclined with respect to the end surface, and an interior angle formed between the end surface and the bevel is larger than or equal to 120° and smaller than or equal to 170°.

A bevel is formed at the end of each leg to prevent a contact failure between the circuit board and the leg.

Other features, elements, characteristics, and advantages of the present disclosure will become more apparent from the following detailed description of embodiments of the present disclosure with reference to the attached drawings.

DESCRIPTION OF THE EMBODIMENTS

First Embodiment

With reference to FIGS. 1 to 11, a component according to the first embodiment mounted on a circuit board will be described. The component according to the first embodiment is mounted on a circuit board to cover multiple surface-mount electronic circuit components mounted on the circuit board. The component according to the first embodiment is used to cover the electronic circuit components, and may thus be called a covering component, a covering member, or a cover.

Figure 1:
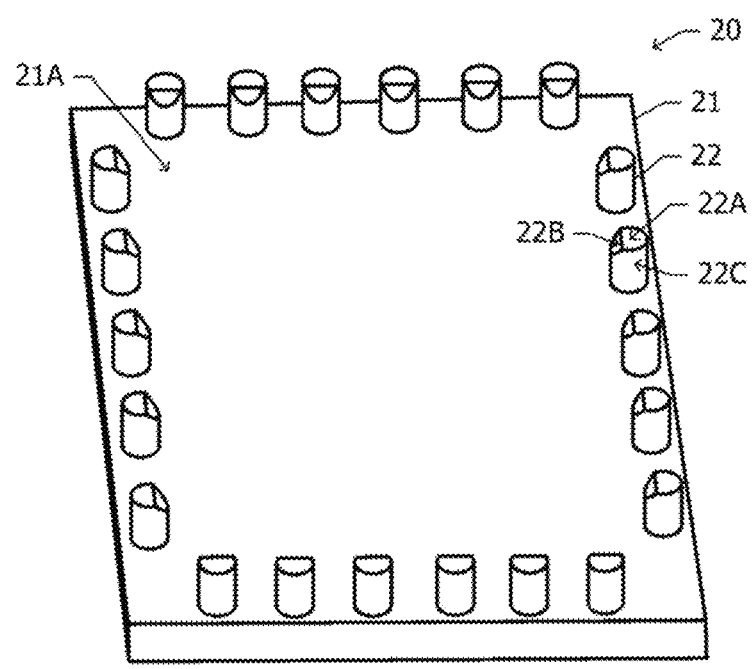
FIG. 1 is a perspective view of a component according to a first embodiment.

FIG. 1 is a perspective view of a component 20 according to the first embodiment. The component 20 according to the first embodiment includes a main member 21 and multiple legs 22. The main member 21 is a plane metal member including a first surface 21A that opposes the circuit board when mounted on the circuit board. Herein, the direction in which the first surface 21A faces is defined as a downward direction. According to this definition, FIG. 1 is a perspective view of the component 20 viewed from obliquely below. The multiple legs 22 protrude downward from the first surface 21A of the main member 21. The multiple legs 22 are arranged at the periphery of the first surface 21A, and along the edge of the first surface 21A substantially throughout while being spaced apart from each other.

The surface of each of the legs 22 includes an end surface 22A that opposes the circuit board while being mounted on the circuit board, a bevel 22B continuous with the end surface 22A, and a side surface 22C. The end surface 22A is parallel to the first surface 21A, and the side surface 22C is substantially perpendicular to the first surface 21A. The end surfaces 22A of the legs 22 are located on a common virtual plane. The bevel 22B is inclined with respect the end surface 22A. In other words, the end of each leg 22 is shaped so that part of the edge of the end surface 22A is chamfered, such that it includes a facet or bevel. "The chamfered shape" indicates the shape of an object obtained by some manufacturing method, and does not limit the manufacturing method to chamfering.

Figure 2:
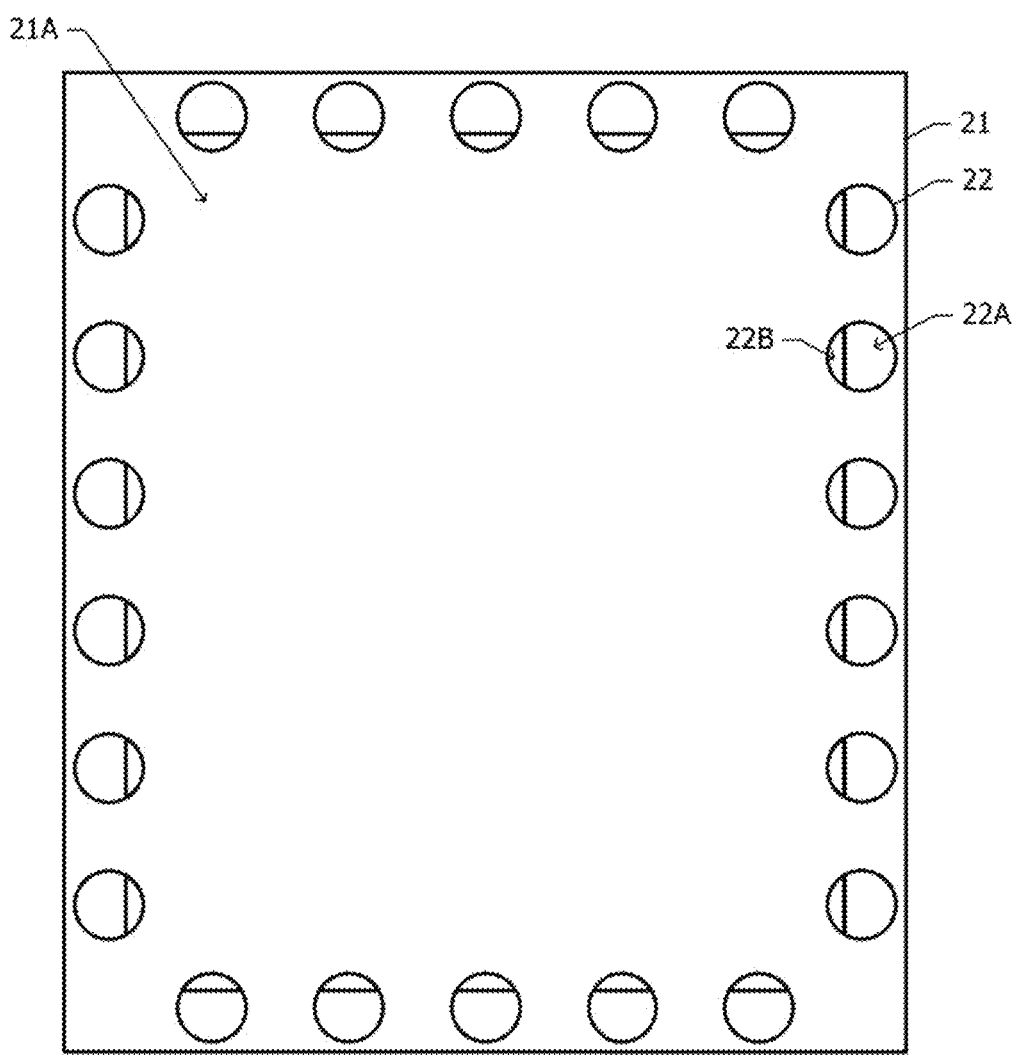
FIG. 2 is a bottom view of the component according to the first embodiment.

FIG. 2 is a bottom view of the component 20 according to the first embodiment. Each of the legs 22 includes the end surface 22A and the bevel 22B. The bevel 22B of each leg 22 is located at a position further, than the end surface 22A, from the edge of the first surface 21A closest to the leg 22. An intersection line of the end surface 22A and the bevel 22B is a straight line.

Figure 3:
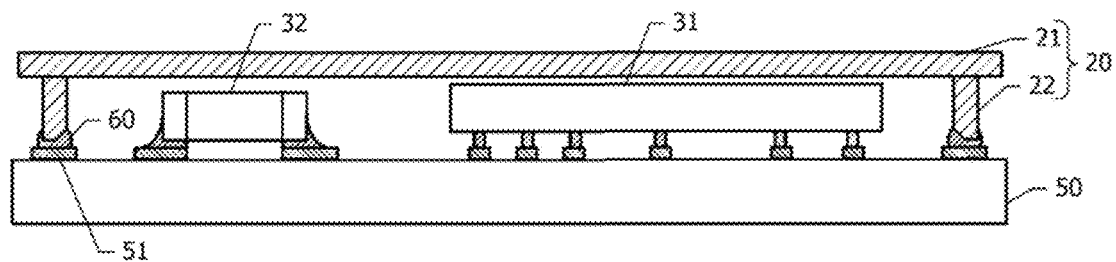
FIG. 3 is a cross-sectional view of a module including the component according to the first embodiment.

FIG. 3 is a cross-sectional view of a module including the component 20 according to the first embodiment. A semiconductor chip 31 and a surface-mount passive component 32 are mounted on the component mount surface of a circuit board 50. The component 20 according to the first embodiment is mounted on the circuit board 50 while having the first surface 21A of the main member 21 opposing the circuit board 50 to cover the semiconductor chip 31 and the passive component 32. In other words, the semiconductor chip 31 and the passive component 32 are covered by (i.e., a positioned within the footprint of) the main member 21 in a plan view, and disposed between the circuit board 50 and the main member 21 in a thickness direction of the circuit board 50.

Multiple lands 51 are disposed on the component mount surface of the circuit board 50. FIG. 3 schematically illustrates the positional relationship between the surface of the circuit board 50 and the lands 51.

In a plan view, some of the lands 51 are disposed to overlap the multiple legs 22 of the component 20. The multiple legs 22 are fixed to the respective lands 51 with solder 60. The legs 22 are connected to a ground conductor (not illustrated) in the circuit board 50 via the solder 60 and the lands 51. The main member 21 of the component 20 is electrically connected to the ground conductor via the legs 22. The component 20 has a function of shielding, against high frequencies (radio frequencies, such as 24 GHz to 300 GHz of the microwave range, the quasi-millimeter wave range, and the Millimeter frequency range), circuit components including the semiconductor chip 31 and the passive component 32 mounted on the circuit board 50.

Figure 4A:
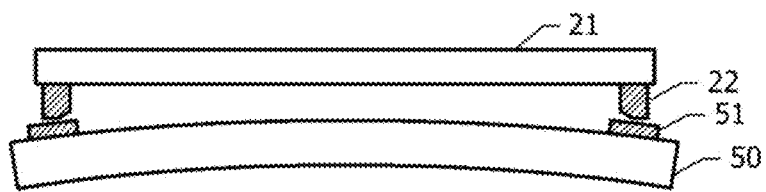
FIG. 4A is a cross-sectional view of the component according to the first embodiment mounted on a warped circuit board.
Figure 4B:
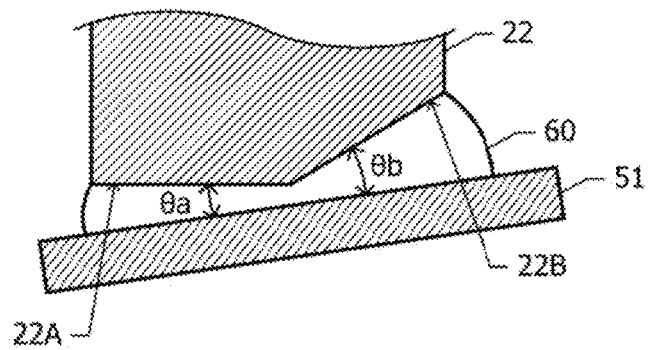
FIG. 4B is a cross-sectional view of an end of a leg of the component according to the first embodiment, a land, and solder.
Figure 4C:
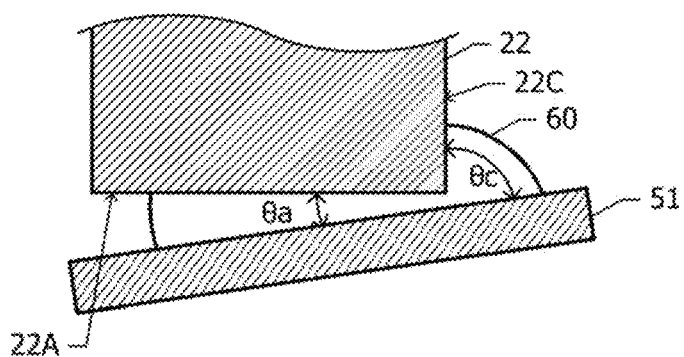
FIG. 4C is a cross-sectional view of an end of a leg of a component according to a comparative example, a land, and solder.

With reference to FIGS. 4A, 4B, and 4C, one effect of the first embodiment will be described.

FIG. 4A is a cross-sectional view of the component 20 according to the first embodiment mounted on the warped circuit board 50. A temperature rise resulting from heating in a mounting process may cause warpage of the circuit board 50. In the example illustrated in FIG. 4A, the component mount surface of the circuit board 50 is warped into a convex shape. To mount the component 20 on the circuit board 50, solder paste is printed on the upper surface of each land 51, and the end of the corresponding leg 22 of the component 20 is placed on the solder paste. In this state, the solder paste is melted, and then solidified.

FIG. 4B is a cross-sectional view of the end of the leg 22 of the component 20 according to the first embodiment, the land 51, and the solder 60. When the circuit board 50 is not warped, the end surface 22A of the leg 22 and the upper surface of the land 51 oppose each other such that they are substantially parallel with each other. When the circuit board 50 is warped, the end surface 22A and the upper surface of the land 51 fail to have a parallel relationship. When the component mount surface is warped into a convex shape, the distance between the end surface 22A and the upper surface of the land 51 is widened from the inner portion of the circuit board 50 toward the outer periphery. The angle formed by the end surface 22A and the upper surface of the land 51 is denoted with θa. The angle formed by the bevel 22B and the upper surface of the land 51 is denoted with θb. When the component mount surface is warped into a convex shape, the angle θb is smaller than when the component mount surface is not warped.

When the solder melts, the end surface 22A and the bevel 22B are wetted with the melted solder. When the solder solidifies, the end surface 22A and the bevel 22B are in contact with the solidified solder 60.

FIG. 4C is a cross-sectional view of the end of the leg 22 of the component according to a comparative example, the land 51, and the solder 60. In the comparative example, the bevel 22B is not formed at the end of each leg 22. When the circuit board 50 is warped to the same extent as that in the example in FIG. 4B, the angle θa formed by the end surface 22A and the upper surface of each land 51 is the same as the angle θa in FIG. 4B. The angle formed by the upper surface of the land 51 and the area of the side surface 22C of the leg 22 facing the inner portion of the circuit board 50 is denoted with θc. The angle θc is larger than the angle θb.

Part of solder between the end surface 22A and the land 51 is pushed aside toward a portion of the side surface 22C closer to the inner portion, and the area near the lower end of the side surface 22C is wetted with the melted solder. The solder pushed aside toward the side surface 22C reduces the amount of solder between the end surface 22A and the land 51, and a partial area of the outer periphery of the end surface 22A fails to be wetted with solder.

Moreover, the angle θc is larger than the angle θb, and thus the side surface 22C (FIG. 4C) is less easily wetted with solder than the bevel 22B (FIG. 4B). The solder pushed aside toward the side surface 22C reduces the amount of solder between the end surface 22A and the land 51. This gives rise to conduction failures between the legs 22 and the lands 51, and conduction failures reduce the RF shielding function of the component 20.

In the first embodiment, the angle θb (FIG. 4B) is smaller than the angle θc (FIG. 4C) of the component according to the comparative example. Thus, the bevel 22B is more easily wetted with solder than the side surface 22C (FIG. 4C). This structure is less likely to cause conduction failures between the legs 22 and the lands 51. Furthermore, the structure of FIG. 4C tends to push more solder from under the surface 22A, and thus increasing the likelihood that a portion of the interface between the anterior portion of the surface 22A and land 51 may fail to be wetted with solder. The bevel 22B formed at the end of each leg 22 can thus reduce conduction failures between the legs 22 and the lands 51.

Another effect of the first embodiment will be described with reference to FIGS. 5A, 5B, and 5C.

Figure 5A:
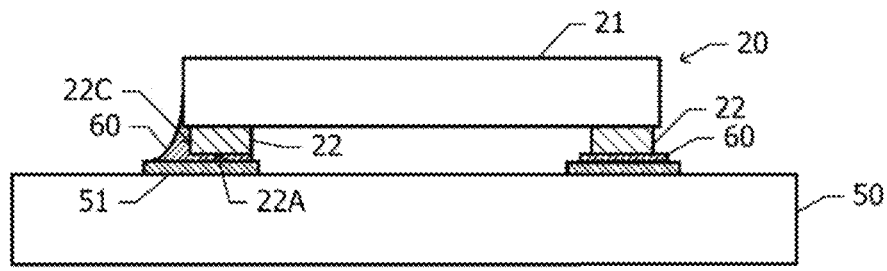
FIGS. 5A and 5B are cross-sectional views of a circuit board and a component according to a comparative example in the process of being mounted on the circuit board.
Figure 5B:
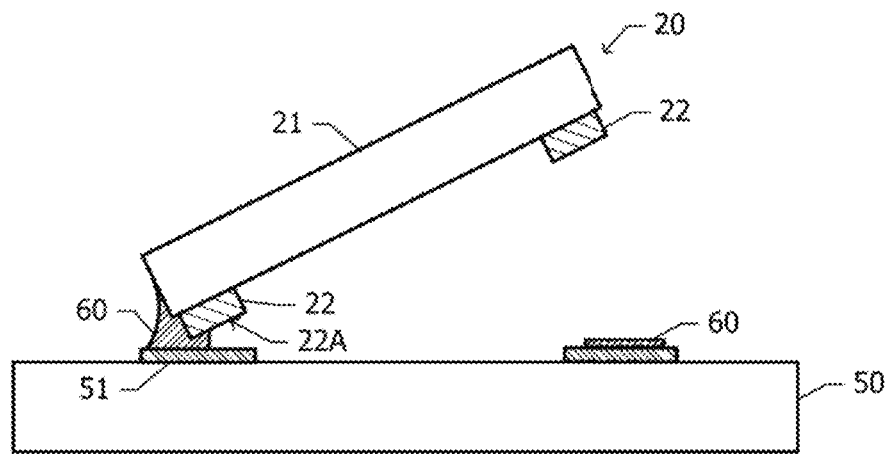

FIGS. 5A and 5B are cross-sectional views of a component 20 according to a comparative example and a circuit board 50 in a process of mounting the component 20 on the circuit board 50. The component according to the comparative example has no bevel 22B (FIG. 1) at the end of each leg 22. The solder 60 in a paste form is printed on the upper surface of each land 51. When the temperature of the circuit board 50 varies between different positions on the surface during reflow soldering, the portions of the solder 60 printed on the multiple lands 51 start melting at different timings.

FIG. 5A illustrates the state where the solder 60 in contact with the left leg 22 is melted, and the solder 60 in contact with the right leg 22 is not melted. The melted solder 60 is pushed aside to the side surface 22C on the outer side of the leg 22. The surface tension of the melted solder 60 exerts, on the component 20, a force of attracting the side surface 22C on the outer side of the leg 22 toward the upper surface of the circuit board 50. The solder 60 under the right leg 22 is not melted. Thus, the right leg 22 is not bonded to the land 51, and no surface tension is exerted on the right leg 22. As illustrated in FIG. 5B, the surface tension of the solder 60 may raise the right edge of the component 20. When the solder 60 is solidified while the component 20 has one side raised, the yield in the process of effectively mounting the component 20 decreases.

Figure 5C:
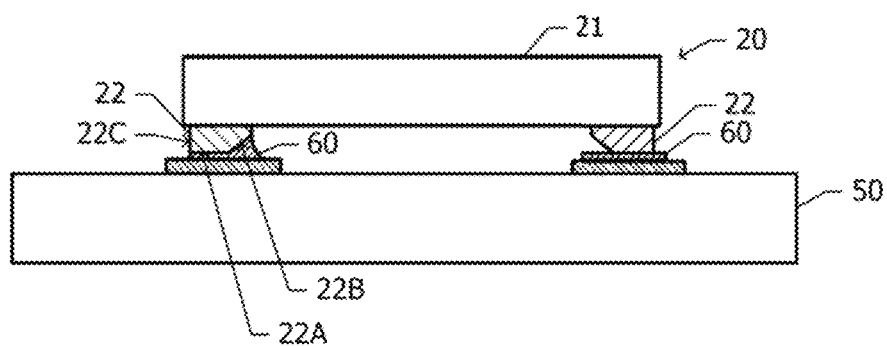
FIG. 5C is a cross-sectional view of the circuit board and the component according to the first embodiment in the process of being mounted on the circuit board.

FIG. 5C is a cross-sectional view of the component 20 according to the first embodiment and the circuit board 50 in the process of mounting the component 20 on the circuit board 50. As in the case of FIG. 5A, in FIG. 5C, the solder 60 in contact with the left leg 22 is melted, and the solder 60 in contact with the right leg 22 is not melted. In the first embodiment, the bevel 22B is formed at the end of the leg 22. The bevel 22B is more easily wetted with the melted solder 60 than the side surface 22C on the outer side of the leg 22. Thus, the melted solder 60 fills the space between the bevel 22B and the land 51 before being pushed aside to the side surface 22C on the outer side. The melted solder 60 is less easily pushed aside to the side surface 22C on the outer side of the leg 22, thus the component 20 is less likely to have one side raised.

Subsequently, with reference to FIGS. 6A and 6B, another effect of the first embodiment will be described.

Figure 6A:
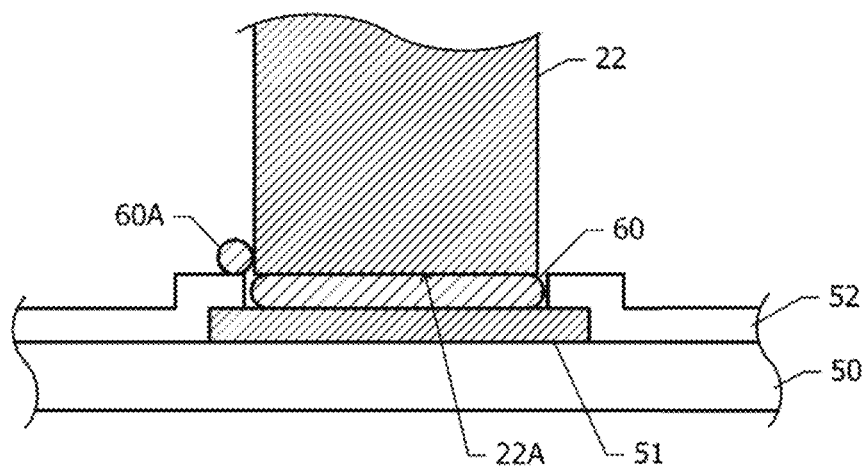
FIGS. 6A and 6B are cross-sectional views each illustrating the surrounding of a leg of the component according to the first embodiment or a comparative example mounted on a circuit board.
Figure 6B:
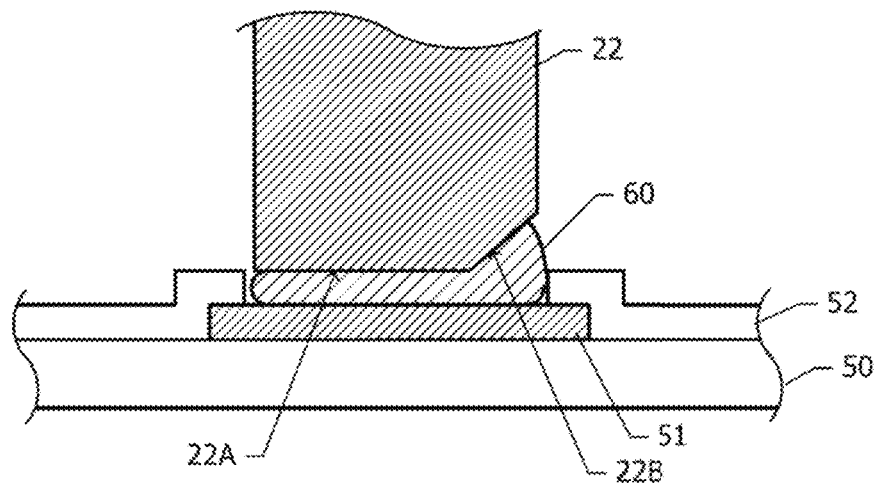

FIGS. 6A and 6B are cross-sectional views each illustrating a portion around a leg 22 of the component 20 according to the first embodiment or according to a comparative example mounted on the circuit board 50. A land 51 is disposed on the component mount surface of the circuit board 50. The component mount surface of the circuit board 50 is covered with a solder resist film 52. The solder resist film 52 has an opening through which the upper surface of each land 51 is exposed. In a plan view, the opening of the solder resist film 52 is slightly smaller than the land 51, and the solder resist film 52 covers the periphery of the upper surface of each land 51. Such a structure is called an over-resist.

In a comparative example (FIG. 6A), excessive solder may flow out of the opening of the solder resist film 52 during reflow soldering. When the solder that flows out of the opening solidifies, the solder is formed into a solder ball 60A. The solder ball 60A left in an end product may cause a short circuit of an electronic circuit.

In the first embodiment (FIG. 6B), the bevel 22B is formed at the end of each leg 22. Thus, the capacity of the solder holding space between the leg 22 and the land 51 increases further than in the comparative example. Thus, excessive solder is less likely to flow out of the opening in the solder resist film 52. This structure can thus prevent an occurrence of solder balls.

FIGS. 6A and 6B illustrate examples where the opening of the solder resist film 52 is slightly smaller than the land 51, but the opening of the solder resist film 52 may be slightly larger than the land 51. Such a structure is called a clearance resist. As in the case of the over-resist, this structure has an effect of preventing an occurrence of solder balls.

Subsequently, another effect of the first embodiment will be described with reference to FIG. 7.

Figure 7:
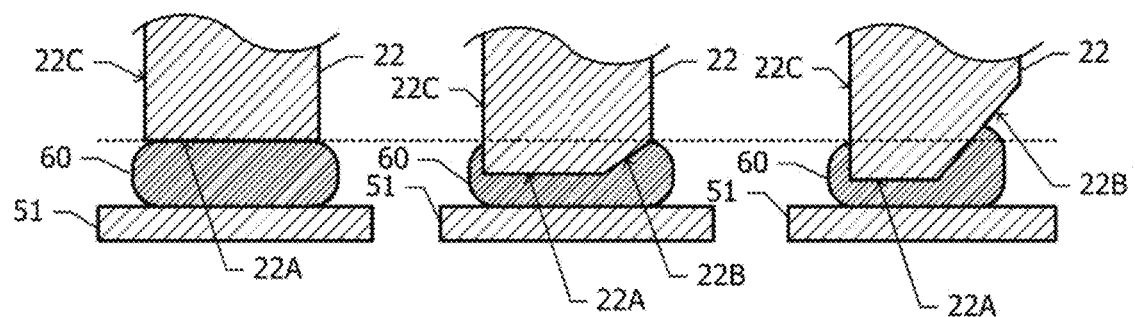
FIG. 7 includes cross-sectional views each illustrating a leg of the component according to the first embodiment or a comparative example, a land, and solder.

FIG. 7 includes cross-sectional views each illustrating the leg 22 of the component 20 according to the first embodiment or a comparative example, the land 51, and the solder 60. The left drawing in FIG. 7 illustrates an example where no bevel is formed at the end of the leg 22, and the center and right drawings each illustrate an example where the bevel 22B is formed at the end of the leg 22. The bevel 22B of the leg 22 in the right drawing is larger than the bevel 22B of the leg 22 in the center drawing.

When the bevel 22B is formed at the end of each leg 22 to reduce the area of the end surface 22A, the leg 22 sinks into the solder 60 by a larger amount. When the leg 22 sinks by a larger amount, the contact area between the leg 22 and the solder 60 increases, and the leg 22 is more firmly fixed to the land 51. The bevel 22B thus formed at the end of each leg 22 can enhance the adhesion strength of the leg 22 to the land 51.

As illustrated in the right drawing, the excessively large bevel 22B reduces the contact area between the leg 22 and the solder 60. The preferable range of the size of the bevel 22B is determined in view of enhancing the adhesion strength.

When the interior angle formed by the end surface 22A and the bevel 22B approaches 90°, the bevel 22B and the side surface 22C are less easily distinguished from each other, and the effects of the first embodiment described with reference to FIGS. 4A to 7 are reduced. In contrast, when the interior angle formed by the end surface 22A and the bevel 22B approaches 180°, the bevel 22B and the end surface 22A are less easily distinguished from each other, and the effects of the first embodiment described with reference to FIGS. 4A to 7 are reduced.

Subsequently, a shape of the end of each leg 22 to fully achieve the above effects will be described with reference to FIGS. 8A to 11.

Figure 8A:
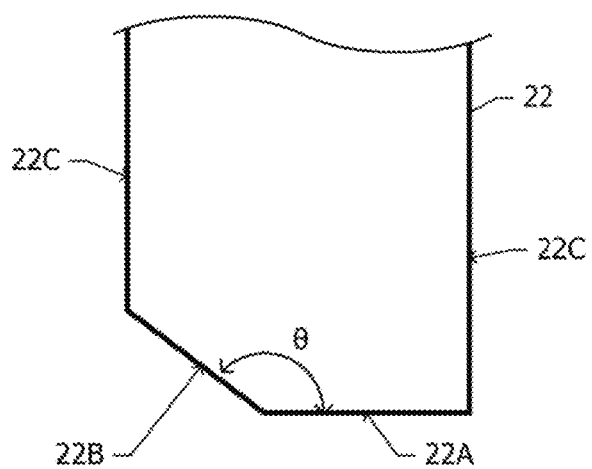
FIGS. 8A and 8B are side views each illustrating an end of a leg of the component according to the first embodiment or a modification example of the first embodiment.

FIG. 8A is a side view of the end of each leg 22 of the component 20 according to the first embodiment. The surface of the leg 22 includes the end surface 22A, the bevel 22B, and the side surface 22C. The interior angle formed between the end surface 22A and the bevel 22B is denoted with θ. The side surface 22C is substantially perpendicular to the end surface 22A.

When the interior angle θ is excessively close to 90°, the bevel 22B and the side surface 22C are less easily distinguished from each other, and the effect of providing the bevel 22B is reduced. To distinguish the bevel 22B and the side surface 22C from each other and fully achieve the effect of providing the bevel 22B, the interior angle θ is preferably larger than or equal to 120°.

When the interior angle θ is excessively close to 180°, the bevel 22B and the end surface 22A are less easily distinguished from each other, and the effect of providing the bevel 22B is reduced. To distinguish the bevel 22B and the end surface 22A from each other and fully achieve the effect of providing the bevel 22B, the interior angle θ is preferably smaller than or equal to 170°.

Figure 8B:
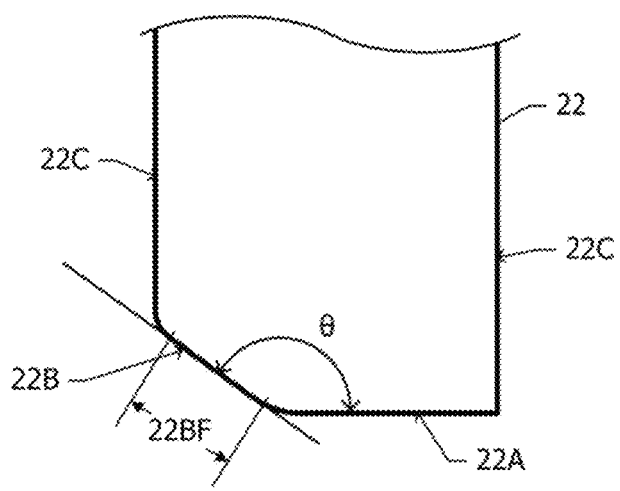

FIG. 8B is a side view of the end of each leg 22 of the component 20 according to a modification example of the first embodiment. In the present modification example, the bevel 22B of the leg 22 includes a curved area at the periphery, and thus the bevel 22B is smoothly connected to the end surface 22A and the side surface 22C. In this case, the interior angle formed between the end surface 22A and a flat area 22BF of the bevel 22B other than the curved area may be defined as the interior angle θ formed between the end surface 22A and the bevel 22B. Also in the present modification example, the interior angle θ formed between the end surface 22A and the bevel 22B is preferably larger than or equal to 120° and smaller than or equal to 170°.

Figure 9:
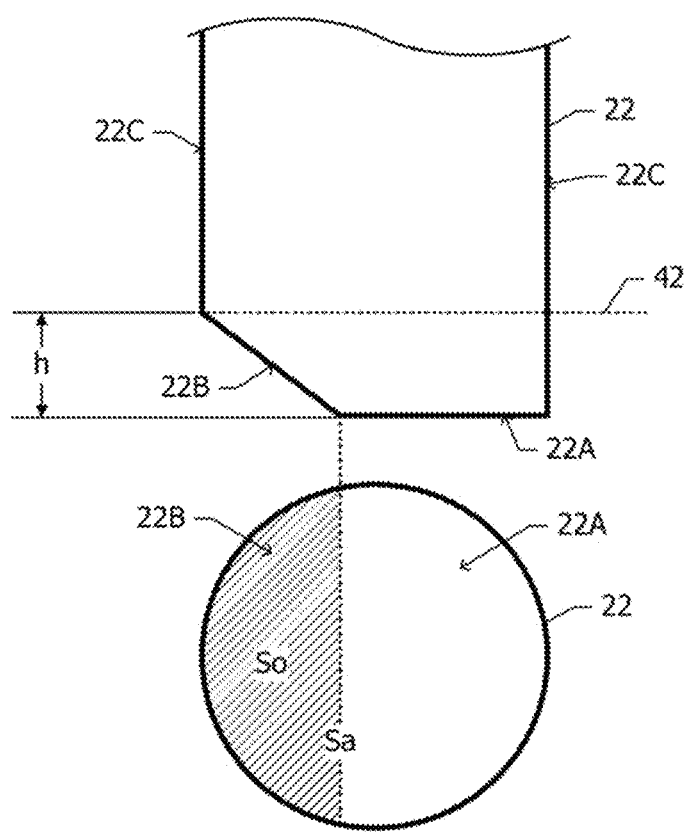
FIG. 9 includes a side view and a plane cross-sectional view of an end of the leg of the component according to the first embodiment.

FIG. 9 includes a side view and a plane cross-sectional view of the end of each leg 22 of the component 20 according to the first embodiment. The area in the plane cross section of the leg 22 at a highest position 42 of the bevel 22B with a height h from the end surface 22A is denoted with Sa. The plane cross section here refers to a cross section parallel to the end surface 22A. The area of an image obtained by perpendicularly projecting the bevel 22B on this cross section is denoted with So. In FIG. 9, the image of the bevel 22B is hatched.

When the area So of the image of the bevel 22B is excessively small, the effect of providing the bevel 22B is reduced. As the area So increases further, as illustrated in the center and right drawings in FIG. 7, the leg 22 sinks by a larger amount, and the contact area between the leg 22 and the solder increases. When the area So increases further beyond a certain point, the contact area between the leg 22 and the solder decreases as the area So increases. To further increase the effect of enhancing the adhesion strength, the area So is preferably larger than or equal to 10% and smaller than or equal to 50% of the area Sa of the leg 22 in a plane cross section.

Figure 10:
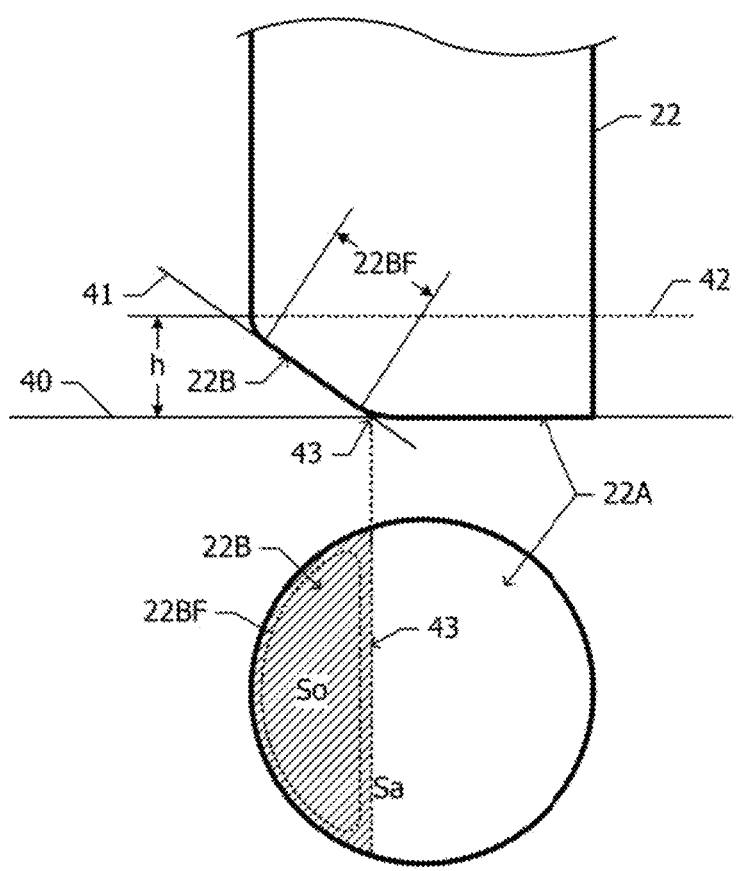
FIG. 10 is a side view and a plane cross-sectional view of an end of a leg of a component according to a modification example of the first embodiment.

FIG. 10 includes a side view and a plane cross-sectional view of the end of each leg 22 of the component 20 of a modification example of the first embodiment. In the present modification example, a curved area is formed around the bevel 22B of the leg 22, and the bevel 22B is smoothly connected to the end surface 22A and the side surface 22C. In this case, an intersection line 43 of a virtual plane 41 including the flat area 22BF of the bevel 22B and a virtual plane 40 including the end surface 22A may be defined as a virtual boundary between the end surface 22A and the bevel 22B. In other words, in the plane cross section of the leg 22 at the highest position 42 of the bevel 22B with the height h from the end surface 22A, the area closer to the flat area 22BF of the bevel 22B than the perpendicularly projected image with respect to the intersection line 43 may be defined as an area So of the image of the bevel 22B.

In the present modification example, to fully achieve the effect of providing the bevel 22B, the area So is preferably larger than or equal to 10% and smaller than or equal to 50% of the area Sa of the leg 22 in a plane cross section.

Figure 11:
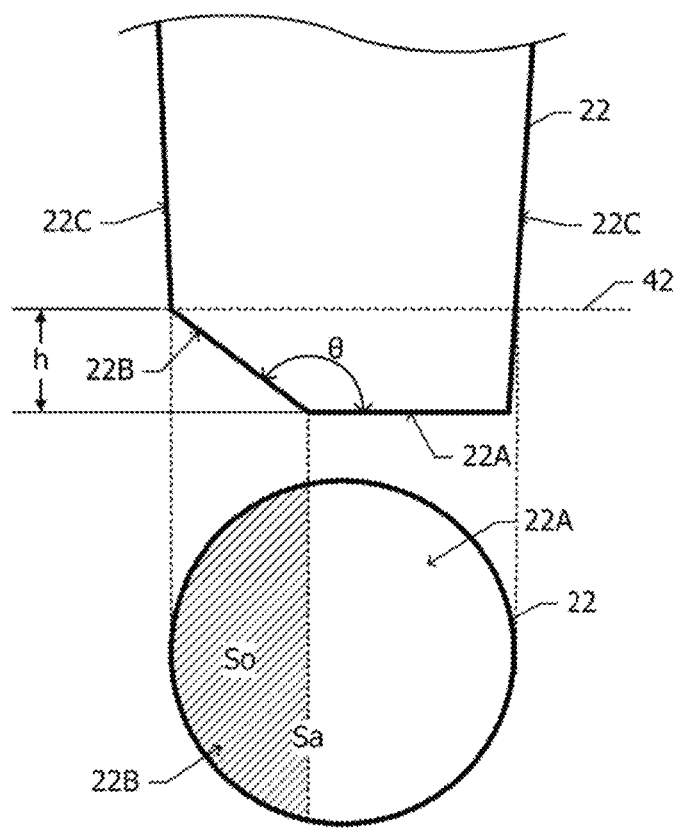
FIG. 11 is a side view and a plane cross-sectional view of an end of a leg of a component according to another modification example of the first embodiment.

FIG. 11 includes a side view and a plane cross-sectional view of the end of the leg 22 of a component 20 according to another modification example of the first embodiment. In the first embodiment (FIG. 8A), the side surface 22C of the leg 22 is substantially perpendicular to the end surface 22A. On the other hand, in the present modification example, the side surface 22C of the leg 22 is inclined with respect to the end surface 22A. For example, the side surface 22C is inclined to taper from the proximal portion to the distal end of the leg 22.

The lower limit of the preferable range of the interior angle θ between the end surface 22A and the bevel 22B is 120°. Thus, the side surface 22C or the extension plane of the side surface 22C that forms an angle of smaller than 120° with the end surface 22A may be regarded as the side surface 22C. The area of the leg 22 in a plane cross section at the highest position 42 of the bevel 22B with the height h from the end surface 22A may be employed as the area Sa of the leg 22 in a plane cross section. In the present modification example, to fully achieve the effect of providing the bevel 22B, the area So of the image of the bevel 22B perpendicularly projected to the plane cross section is preferably larger than or equal to 10% and smaller than or equal to 50% of the area Sa of the leg 22 in a plane cross section.

Figure 12:
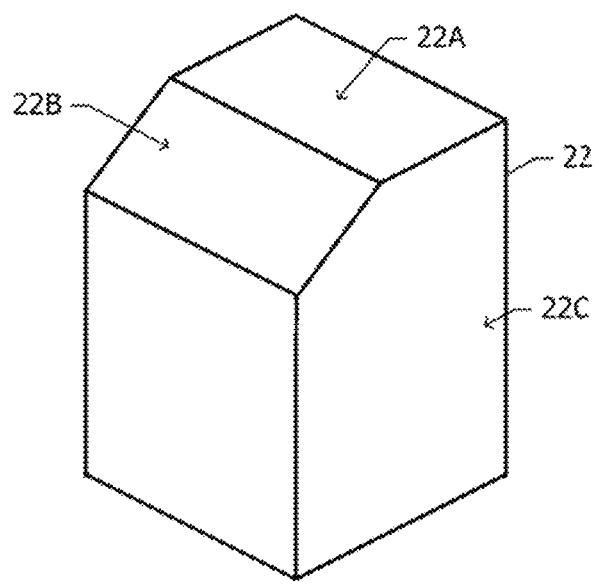
FIG. 12 is a perspective view of a leg of a component according to another modification example of the first embodiment.

With reference to FIG. 12, components according to another modification example of the first embodiment will be described.

FIG. 12 is a perspective view of the leg 22 of a component 20 according to another modification example of the first embodiment. In the first embodiment (FIG. 1), each leg 22 has a shape of a cylinder with part of the edge at the end chamfered. On the other hand, each leg 22 of the component 20 according to the present modification example has a quadrangular prism shape with a square or rectangular bottom surface, and with one side at the end chamfered. The end surface 22A and the bevel 22B are rectangular.

As in the present modification example, the legs 22 may have a shape other than a cylinder, and may have a quadrangular prism shape. Instead, the legs 22 may have a shape of, for example, a polygonal prism or a cylindroid.

Second Embodiment

Figure 13:
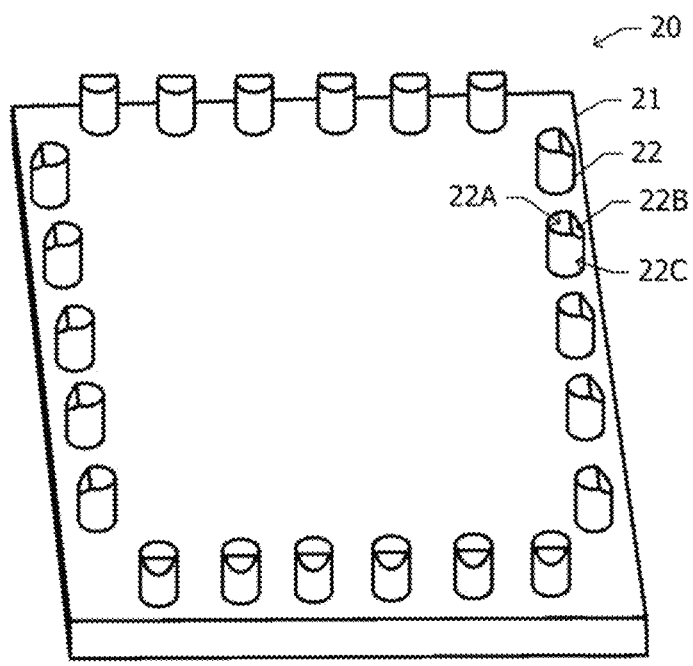
FIG. 13 is a perspective view of a component according to a second embodiment.
Figure 14:
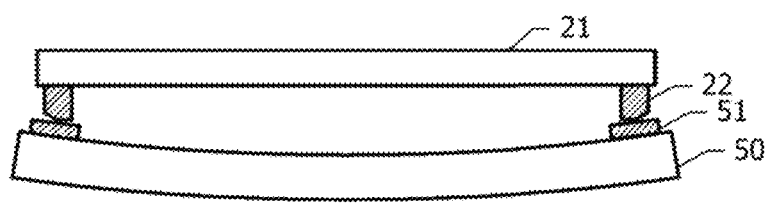
FIG. 14 is a cross-sectional view of a component according to the second embodiment mounted on a warped circuit board.

With reference to FIGS. 13 and 14, a component according to a second embodiment will be described. Components the same as the components of the first embodiment and the modification examples of the first embodiment described with reference to FIGS. 1 to 11 will not be described below.

FIG. 13 is a perspective view of a component 20 according to the second embodiment. In the first embodiment (FIGS. 1 and 2), the bevel 22B of each leg 22 is located further, than the end surface 22A, from the closest edge of the first surface 21A. In contrast, in the second embodiment, the bevel 22B of each leg 22 is located closer, than the end surface 22A, to the periphery of the first surface 21A.

With reference to FIG. 14, effects of the second embodiment will be described.

FIG. 14 is a cross-sectional view of the component 20 according to the second embodiment mounted on the warped circuit board 50. As described with reference to FIGS. 4A and 4B, the first embodiment reduces an occurrence of conduction failures when the component mount surface of the circuit board 50 is warped into a convex shape. In contrast, the second embodiment reduces an occurrence of conduction failures when the component mount surface of the circuit board 50 is warped into a concave shape. Whether the component 20 according to the first embodiment or the component 20 according to the second embodiment is employed may be determined depending on the warpage of the circuit board 50 on which the component 20 is to be mounted.

The second embodiment also has an effect of reducing an occurrence of the solder ball 60A described with reference to FIGS. 6A and 6B. The second embodiment also has an effect of enhancing the adhesion strength described with reference to FIG. 7.

Third Embodiment

Figure 15A:
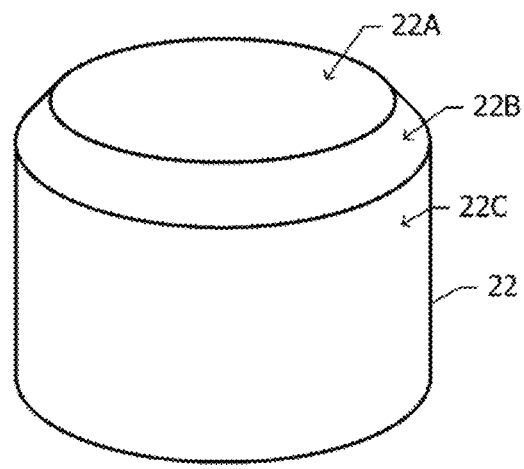
FIGS. 15A and 15B are perspective views each illustrating a leg of a component according to a third embodiment or a modification example of the third embodiment.
Figure 15B:
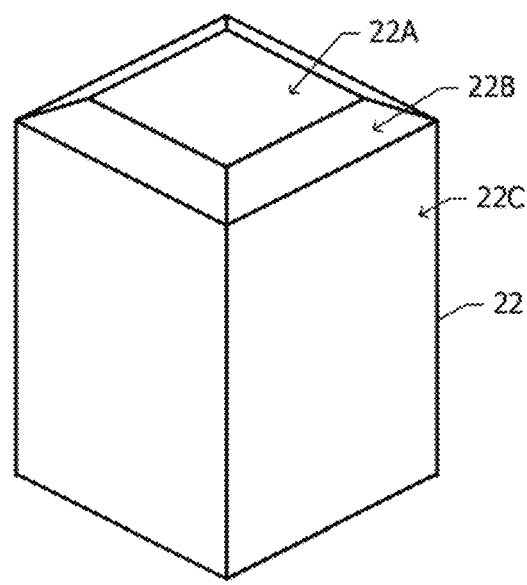

With reference to FIGS. 15A and 15B, components according to a third embodiment and a modification example of the third embodiment will be described. Components the same as the components of the first embodiment and the modification examples of the first embodiment described with reference to FIGS. 1 to 11 will not be described below.

FIG. 15A is a perspective view of a leg 22 of a component according to a third embodiment. In the first embodiment (FIG. 1), the bevel 22B is continuous to a part of the periphery of the end surface 22A. In contrast, in the third embodiment illustrated in FIG. 15A, the bevel 22B is formed throughout the peripheral edge of the end surface 22A. For example, the leg 22 has a shape of a cylinder with one circular end surface entirely chamfered.

FIG. 15B is a perspective view of a leg 22 of a component 20 according to a modification example of the third embodiment. The leg 22 of the component 20 according to the present modification example has a quadrangular prism with a square or rectangular bottom surface, and with four sides at the end chamfered.

Subsequently, effects of the third embodiment and a modification example of the third embodiment will be described.

Components according to the third embodiment and the modification example of the third embodiment also have the same effects as those of the first embodiment. For example, the third embodiment and the modification example have an effect of reducing conduction failures between the legs 22 and the lands 51 described with reference to FIGS. 4A and 4B, an effect of reducing an occurrence of the solder ball 60A described with reference to FIGS. 6A and 6B, and an effect of enhancing the adhesion strength of the legs 22 to the lands 51 described with reference to FIG. 7.

Fourth Embodiment

Figure 16A:
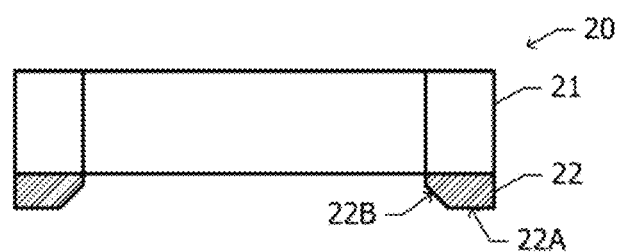
FIGS. 16A and 16B are a side view and a bottom view of a component according to a fourth embodiment.
Figure 16B:
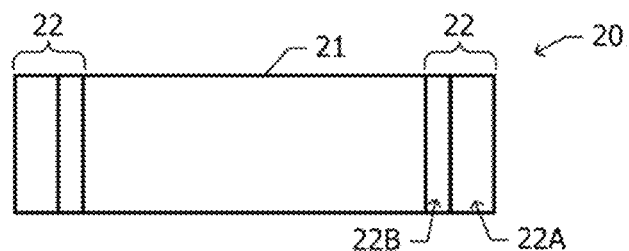

With reference to FIGS. 16A and 16B, components according to a fourth embodiment and a modification example of the fourth embodiment will be described. Components the same as the components of the first embodiment and the modification examples of the first embodiment described with reference to FIGS. 1 to 11 will not be described below.

FIGS. 16A and 16B are respectively a side view and a bottom view of a component 20 according to a fourth embodiment. The component 20 according to the first embodiment (FIG. 3) is used to shield, against high frequencies, the semiconductor chip 31, the passive component 32, and other components mounted on the circuit board 50. In contrast, the component 20 according to the fourth embodiment is a surface-mount passive component such as a capacitor or an inductor. The capacitor or the inductor is formed inside the main member 21. The legs 22 function as external connection terminals of the capacitor or the inductor.

As in the case of the legs 22 of the component 20 according to the first embodiment (FIG. 1), the legs 22 used as external connection terminals each include an end surface 22A and a bevel 22B. The main member 21 has a rectangular shape in a plan view. Two legs 22 are disposed at both ends of the rectangular bottom surface of the main member 21. The bevel 22B is disposed closer to the inner portion (geometric center) of the bottom surface than the end surface 22A.

Effects of the fourth embodiment will be described below.

The component according to the fourth embodiment also has the same effects as those of the first embodiment. For example, the fourth embodiment has an effect of preventing the component 20 from having one side raised during reflow soldering described with reference to FIGS. 5A, 5B, and 5C. The fourth embodiment also has an effect of reducing an occurrence of the solder ball 60A described with reference to FIGS. 6A and 6B, and an effect of enhancing the adhesion strength of the legs 22 to the lands 51 described with reference to FIG. 7.

A modification example of the fourth embodiment will now be described. The component 20 according to the fourth embodiment is a discrete surface-mount passive component such as a capacitor or an inductor. Instead, an integrated passive device (IPD) may include legs 22 with the same shape as those of the legs 22 of the component 20 according to the first embodiment.

Fifth Embodiment

Figure 17A:
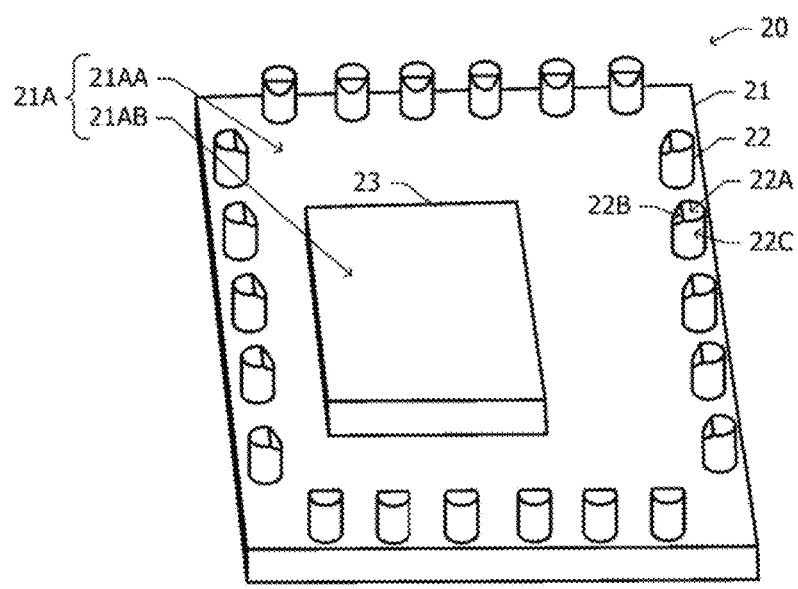
FIG. 17A is a perspective view of a component according to a fifth embodiment.
Figure 17B:
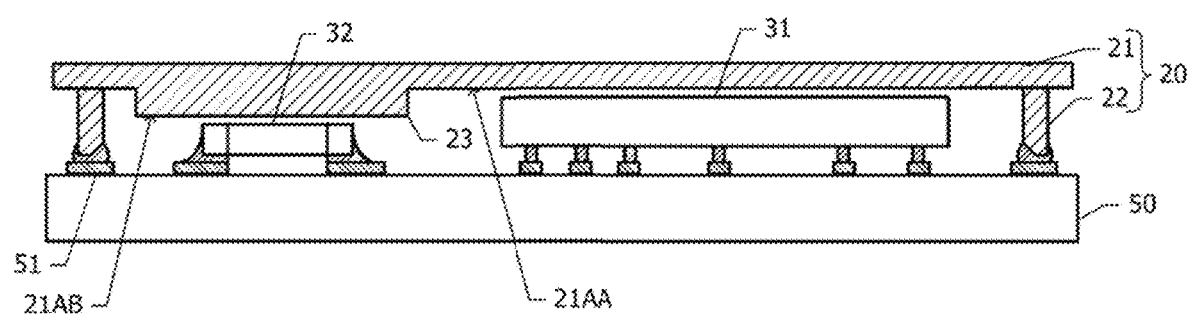
FIG. 17B is a cross-sectional view of a module including a component according to the fifth embodiment.

With reference to FIGS. 17A and 17B, a component according to a fifth embodiment will be described. Components the same as the components of the first embodiment described with reference to FIGS. 1 to 11 will not be described below.

FIG. 17A is a perspective view of a component 20 according to a fifth embodiment. In the first embodiment (FIG. 1), the first surface 21A of the main member 21 is formed from a single plane. In contrast, the first surface 21A of the main member 21 of the component 20 according to the fifth embodiment includes a protrusion 23 protruding in a direction (downward) in which the legs 22 protrude. The first surface 21A includes a top surface 21AB of the protrusion 23 and a surface area 21AA surrounding the protrusion 23 in a plan view. The top surface 21AB of the protrusion 23 is parallel to the surrounding surface area 21AA, and the side surfaces of the protrusion 23 are substantially perpendicular to the surface area 21AA.

The multiple legs 22 are arranged at the periphery of the first surface 21A to surround the protrusion 23 in a plan view. Here, "the periphery of the first surface 21A" refers to, when the first surface 21A is viewed in a plan, a frame-shaped area with a certain width with the edge defining the profile of the first surface 21A serving as a peripheral line. As in the case of the legs 22 (FIG. 1) of the component 20 according to the first embodiment, each of the legs 22 includes the end surface 22A, the bevel 22B, and the side surface 22C.

The protrusion 23 is lower than the legs 22 with reference to the height of the surface area 21AA. In other words, the top surface 21AB of the protrusion 23 is located lower than the virtual plane including the end surfaces 22A of the multiple legs 22.

FIG. 17B is a cross-sectional view of a module including the component 20 according to the fifth embodiment. The semiconductor chip 31 and the passive component 32 are surface-mounted on the component mount surface of the circuit board 50. With reference to the height of the component mount surface of the circuit board 50, the top surface of the semiconductor chip 31 is located higher than the top surface of the passive component 32. In a plan view, the protrusion 23 and the passive component 32 overlap each other, and the surface area 21AA and the semiconductor chip 31 overlap each other.

Effects of the Fifth Embodiment will be Described.

The component according to the fifth embodiment also has the same effects as those of the first embodiment. Specifically, the fifth embodiment has an effect of preventing the component 20 from having one side raised during reflow soldering, an effect of reducing an occurrence of the solder ball 60A, and an effect of enhancing the adhesion strength of the legs 22 to the lands 51.

Instead of the first surface 21A of the main member 21 of the component 20 formed from a single plane, the first surface 21A may be formed from the surface area 21AA and the top surface 21AB of the protrusion 23, as in the case of the component 20 according to the fifth embodiment. The top surface of the passive component 32 with a lower height from the component mount surface of the circuit board 50 opposes the top surface 21AB of the protrusion 23, so that the distance from the passive component 32 to the main member 21 can be reduced. This structure can enhance the shielding effect.

A Modification Example of the Fifth Embodiment will be Described Below.

In the fifth embodiment, with reference to the height of the component mount surface of the circuit board 50, the top surface of the passive component 32 is disposed lower than the top surface of the semiconductor chip 31. In contrast, when the top surface of the semiconductor chip 31 is located lower than the top surface of the passive component 32, the protrusion 23 may be disposed in an area overlapping the semiconductor chip 31 in a plan view. In the fifth embodiment, the side surfaces of the protrusion 23 are substantially perpendicular to the surface area 21AA. Instead, the side surfaces of the protrusion 23 may be inclined with respect to the surface area 21AA.

Sixth Embodiment

Figure 18:
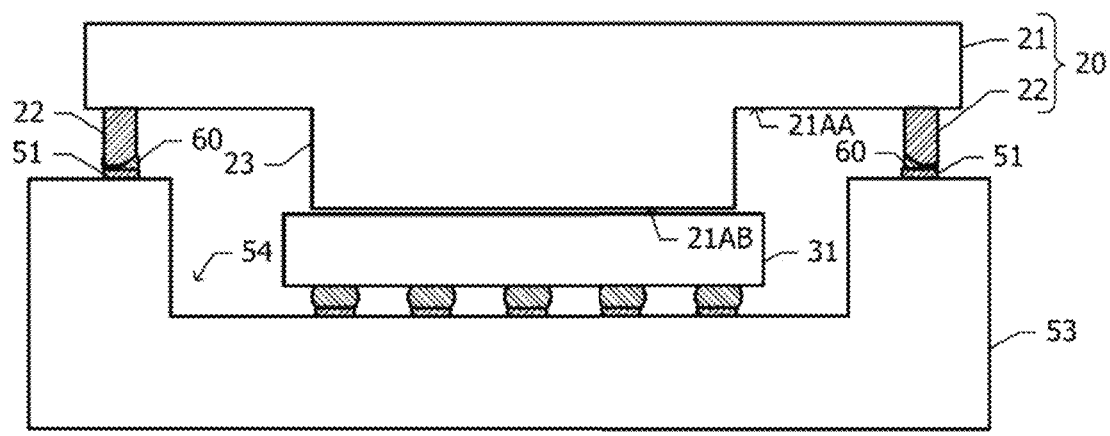
FIG. 18 is a cross-sectional view of a module including a component according to a sixth embodiment.

With reference to FIG. 18, a component according to a sixth embodiment will be described. Components the same as the components of the fifth embodiment described with reference to FIGS. 17A and 17B will not be described below.

FIG. 18 is a cross-sectional view of a module including a component 20 according to a sixth embodiment. The component 20 (FIG. 17B) according to the fifth embodiment is mounted on the circuit board 50 with a flat component mount surface. In contrast, the component 20 according to the sixth embodiment is mounted on a cavity substrate 53 including a cavity 54 in an outer layer. The cavity 54 accommodates the semiconductor chip 31.

The multiple lands 51 are arranged on the upper surface of the cavity substrate 53 to surround the cavity 54 in a plan view. The multiple legs 22 of the component 20 are fixed to these lands 51 via the solder 60.

In the fifth embodiment (FIG. 17B), the height from the surface area 21AA of the main member 21 of the component 20 to the top surface 21AB of the protrusion 23 is lower than the height from the surface area 21AA to the end surface 22A of each leg 22. In contrast in the sixth embodiment, the height from the surface area 21AA of the main member 21 of the component 20 to the top surface 21AB of the protrusion 23 is higher than the height to the end surface 22A of each leg 22. Thus, while the component 20 is mounted on the cavity substrate 53, part of the protrusion 23 is inserted into the cavity 54, and the top surface 21AB is located inside the cavity 54. The top surface 21AB opposes the top surface of the semiconductor chip 31 accommodated in the cavity 54.

Effects of the sixth embodiment will be described. As in the case of the fifth embodiment, the sixth embodiment also has an effect of preventing the component 20 from having one side raised during reflow soldering, an effect of reducing an occurrence of the solder ball 60A, and an effect of enhancing the adhesion strength of the legs 22 to the lands 51. In addition, according to the sixth embodiment, the top surface 21AB of the protrusion 23 of the component 20 is located inside the cavity 54, and thus the distance between the protrusion 23 and the semiconductor chip 31 is reduced. This structure can enhance the shielding effect.

Seventh Embodiment

A component according to a seventh embodiment will be described below with reference to FIG. 19. Components the same as the components of the fifth embodiment described with reference to FIGS. 17A and 17B will not be described below.

Figure 19:
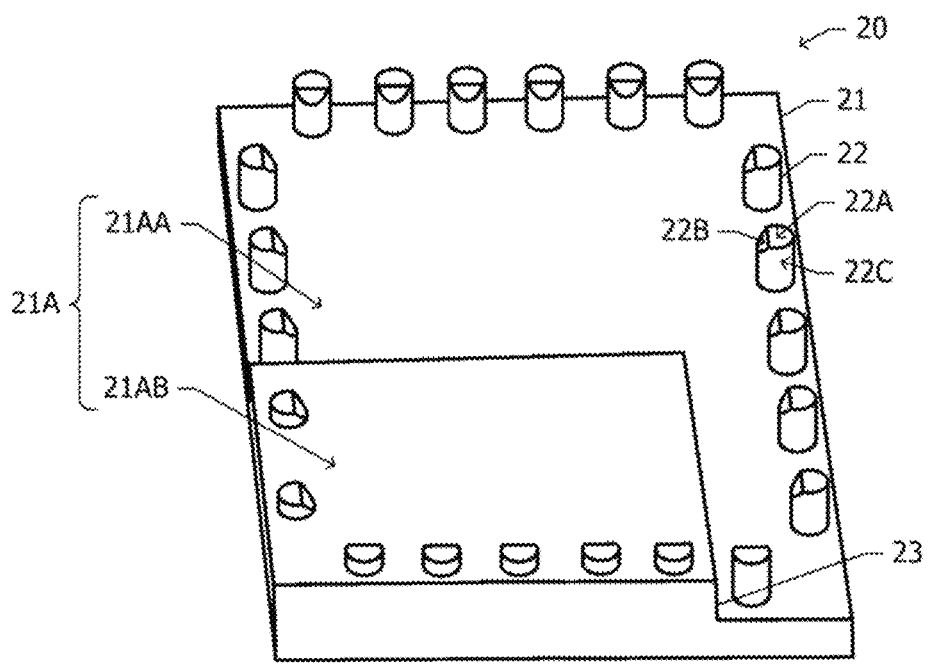
FIG. 19 is a perspective view of a component according to a seventh embodiment.

FIG. 19 is a perspective view of a component 20 according to a seventh embodiment. In the fifth embodiment (FIG. 17A), the protrusion 23 is disposed at the inner portion of the first surface 21A. In contrast in the seventh embodiment, the protrusion 23 is disposed in contact with part of the edge of the first surface 21A. Some of the multiple legs 22 are arranged on the top surface 21AB of the protrusion 23. Also in this case, the multiple legs 22 are arranged at the periphery of the first surface 21A, as in the case of the fifth embodiment (FIG. 17A).

The multiple legs 22 have such heights that the end surfaces 22A of all the legs 22 are located on a common virtual plane. Specifically, the height of the legs 22 arranged on the top surface 21AB of the protrusion 23 is lower than the height of the legs 22 arranged on the surface area 21AA.

Effects of the seventh embodiment will be described. As in the case of the fifth embodiment, the seventh embodiment also has an effect of preventing the component 20 from having one side raised during reflow soldering, an effect of reducing an occurrence of the solder ball 60A, and an effect of enhancing the adhesion strength of the legs 22 to the lands 51. As in the case of the seventh embodiment, the multiple legs 22 may be arranged in areas of the first surface 21A with different heights.

The above embodiments are mere examples, and components of different embodiments may naturally be partially replaced with or combined with each other. The same effects between multiple embodiments may not be described in each embodiment. The present disclosure is not limited to the above embodiments. For example, it is obvious to those skilled in the art that the embodiments may be modified, improved, or combined as appropriate.

While preferred embodiments of the disclosure have been described above, it is to be understood that variations and modifications will be apparent to those skilled in the art without departing from the scope and spirit of the invention. The scope of the invention, therefore, is to be determined solely by the following claims.

What is claimed is:

1. An electrical device comprising:
a circuit board;
lands separate from and disposed on the circuit board;
a component that comprises:
  a main member that includes a first surface that is separated from a surface of the circuit board, the component being configured to be mounted to the lands disposed on the circuit board via a plurality of leas having a columnar shape and that are connected to the first surface of the main member along a periphery region of the first surface of the main member such that the plurality of legs extend from the first surface toward the circuit board, the periphery region being offset from an outer edge of the first surface of the main member; and
  the plurality of legs, each of the plurality of leas having an end,
wherein each end of the plurality of legs includes:
  an end surface that is parallel to the surface of the circuit board, and
  a bevel that is inclined with respect to the end surface and that includes a flat surface portion; and
solder disposed between the lands disposed on the circuit board and the respective end surfaces and bevels of the ends of the plurality of legs,
wherein, for each of the plurality of legs:
  an angle formed between the end surface of the leg and the flat surface portion of the bevel is larger than or equal to 120° and smaller than or equal to 170°, and
  an area of the flat surface portion of the bevel is larger than or equal to 10%, and smaller than or equal to 50%, of an area of the end surface of the leg.

2. The electrical device according to claim 1, wherein the bevel of each of the plurality of legs is a single bevel that faces inward from the periphery region.

3. The electrical device according to claim 1, wherein the bevel of each of the plurality of legs is a single bevel that faces outward toward the periphery region.

4. The electrical device according to claim 1, wherein, for each of the plurality of legs, the bevel circumscribes an edge of the end surface.

5. The electrical device according to claim 1, wherein, for each of the plurality of legs, the bevel further includes an upper curved section connected to the flat surface portion of the bevel and a lower curved section connected to the flat surface portion of the bevel.

6. The electrical device according to claim 1, wherein the main member comprises metal.

7. The electrical device according to claim 6, wherein the plurality of legs separate the main member from the circuit board by a predetermined amount.

8. The electrical device according to claim 7, wherein:
the predetermined amount is sized to accommodate an electronic component between the main member and the circuit board.

9. The electrical device according to claim 8, wherein:
the main member shields the electronic component from RF energy.

10. The electrical device according to claim 9, wherein:
the RF energy is in an inclusive range of 30 GHz through 300 GHz.

11. The electrical device according to claim 1,
wherein, in a plan view, the first surface of the main member has a quadrilateral shape, and
wherein the plurality of legs, having the columnar shape and that are connected to the first surface of the main member along the periphery region of the first surface of the main member, comprise a first through fourth pluralities of legs located on first through fourth edges of the quadrilateral shape.

12. The electrical device according to claim 1,
wherein, in a plan view, the first surface of the main member has a predefined two-dimensional shape, and
wherein the plurality of legs, having the columnar shape and that are connected to the first surface of the main member along the periphery region of the first surface of the main member, circumscribe edge portions of predefined two-dimensional shape with a predetermined distance therebetween.

13. A component comprising:
a main member that includes a first surface, the component being configured to be mounted to lands disposed on a circuit board via a plurality of legs such that the first surface of the main member is separated from a surface of the circuit board,
wherein each of the plurality of legs have a columnar shape and are connected to the first surface of the main member along a periphery region of the first surface of the main member such that the plurality of legs extend from the first surface toward the circuit board, the periphery region being offset from an outer edge of the first surface of the main member; and
the plurality of legs, each of the plurality of legs having an end,
wherein each end of the plurality of legs includes:
  an end surface that is parallel to the surface of the circuit board, and
  a bevel that is inclined with respect to the end surface and that includes a flat surface portion; and
wherein the end surfaces and bevels of the ends of the plurality of legs are configured to be fixed to respective lands via a solder interposed therebetween,
wherein, for each of the plurality of legs:
  an angle formed between the end surface of the leg and the flat surface portion of the bevel is larger than or equal to 120° and smaller than or equal to 170°, and
  an area of the flat surface portion of the bevel is larger than or equal to 10%, and smaller than or equal to 50%, of an area of the end surface of the leg.

14. The according to claim 13,
wherein, in a plan view, the first surface of the main member has a quadrilateral shape, and
wherein the plurality of legs, having the columnar shape and that are connected to the first surface of the main member along the periphery region of the first surface of the main member, comprise a first through fourth pluralities of legs located on first through fourth edges of the quadrilateral shape.

15. The according to claim 13,
wherein, in a plan view, the first surface of the main member has a predefined two-dimensional shape, and
wherein the plurality of legs, having the columnar shape and that are connected to the first surface of the main member along the periphery region of the first surface of the main member, circumscribe edge portions of predefined two-dimensional shape with a predetermined distance therebetween.

* * * * *